(12) United States Patent
Glovatsky et al.

(10) Patent No.: US 7,215,557 B2
(45) Date of Patent: May 8, 2007

(54) ASSEMBLY COMPRISING MULTIPLE MICROELECTRONIC MODULES

(75) Inventors: Andrew Z. Glovatsky, Plymouth, MI (US); Vladimir Stoica, Farmington Hills, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 688 days.

(21) Appl. No.: 10/648,910

(22) Filed: Aug. 27, 2003

(65) Prior Publication Data

US 2006/0176677 A1    Aug. 10, 2006

(51) Int. Cl.
*H05K 1/11*    (2006.01)
(52) U.S. Cl. .................. 361/804; 361/792; 361/790; 361/748; 361/760
(58) Field of Classification Search ............... 361/792, 361/752, 790, 797, 760, 748
See application file for complete search history.

(56) References Cited

U.S. PATENT DOCUMENTS

| | | | |
|---|---|---|---|
| 3,434,014 A | 3/1969 | Taynton | |
| 3,596,140 A * | 7/1971 | Walsh | 361/784 |
| 3,755,891 A | 9/1973 | Muckelroy et al. | |
| 4,051,414 A | 9/1977 | Will et al. | |
| 4,399,488 A | 8/1983 | Ruwe et al. | |
| 4,503,484 A * | 3/1985 | Moxon | 361/736 |
| 4,513,064 A | 4/1985 | Marcus | |
| 4,810,917 A | 3/1989 | Kumar et al. | |
| 4,833,568 A | 5/1989 | Berhold | |
| 5,204,806 A | 4/1993 | Sasaki et al. | |
| 6,351,383 B1 * | 2/2002 | Payton | 361/704 |

* cited by examiner

*Primary Examiner*—Tuan T. Dinh
*Assistant Examiner*—Hung S. Bui
(74) *Attorney, Agent, or Firm*—Brinks Hofer Gilson & Lione

(57) ABSTRACT

An assembly that includes two or more microelectronic modules in a self-sustaining structure that is adapted to be installed in a housing. The microelectronic modules are affixed to supports that are attached to ribs and arranged in parallel-spaced relationship. When the assembly is received in a housing, the ribs engage the inner wall of the housing to securely position the assembly. Also, the ribs space the microelectronic modules apart from the housing to facilitate coolant gas flow through the housing and thereby improve thermal dissipation during operation.

8 Claims, 2 Drawing Sheets

(SECTION A-A)

ASSEMBLY COMPRISING MULTIPLE MICROELECTRONIC MODULES

TECHNICAL FIELD OF THE INVENTION

This invention relates to an assembly that includes multiple microelectronic modules and is received in a housing. More particularly, this invention relates to such assembly that includes outboard ribs that arrange the microelectronic modules in parallel, spaced relationship and space the modules apart from the housing.

BACKGROUND OF THE INVENTION

A microelectronic module comprises electronic components mounted on a printed circuit board, which may be a rigid board of a flexible membrane. It is known to package multiple microelectronic modules within a housing. The modules may be joined in an assembly to facilitate installation into the housing as a single, self-sustaining structure. For rigid circuit boards, the modules may be arranged in parallel, spaced relationship by posts that are bolted or otherwise connected directly to the boards. However, flexible membranes do not provide suitable support for flexible membranes, so that the assembly tends to bend, resulting in damage to the electronic components or the electrical connection.

The size and shape of the housing is largely dependent upon the nature of the product. In some instances, it is desired to provide a tubular housing. For example, in military missiles, the housing may have a cylindrical shape. The microelectronic assemblies may be arranged so that the printed circuit boards are perpendicular to the axis, thereby providing additional volume within the housing for other components, such as batteries, gyroscopic components, motors or ordinants. The boards may be installed with minimal clearance to the housing to prevent lateral movement that might otherwise damage the modules. However, such minimal clearance restricts the flow of coolant gas through the housing that is needed for dissipation of heat generated by the electronic components during operation.

Therefore, a need exists for an assembly that may be readily installed into a housing and includes multiple microelectronic modules that are arranged in spaced, parallel relationship, and further wherein the assembly securely positions the modules spaced apart from the housing to facilitate coolant gas flow through the housing and thereby improve thermal dissipation during operation.

SUMMARY OF THE INVENTION

In accordance with this invention, an assembly comprising two or more microelectronic modules is provided that is adapted to be installed in the housing. Each microelectronic module is affixed to a support having a perimeter. Ribs are attached to the supports at the perimeters and extend outboard of the modules. The ribs arrange the supports, and thus the modules, in parallel, spaced arrangement. When the assembly is received in a housing, the ribs engage the inner wall of the housing to securely position the assembly and prevent lateral movement that might otherwise damage the electronic components or the electrical connections. In addition, the ribs space the microelectronic modules apart from the housing to permit coolant gas flow through the housing for thermal dissipation.

SUMMARY OF THE FIGURES

This invention will be further illustrated with reference to the accompanying drawings wherein.

DETAILED DESCRIPTION OF THE INVENTION

Figure 1:
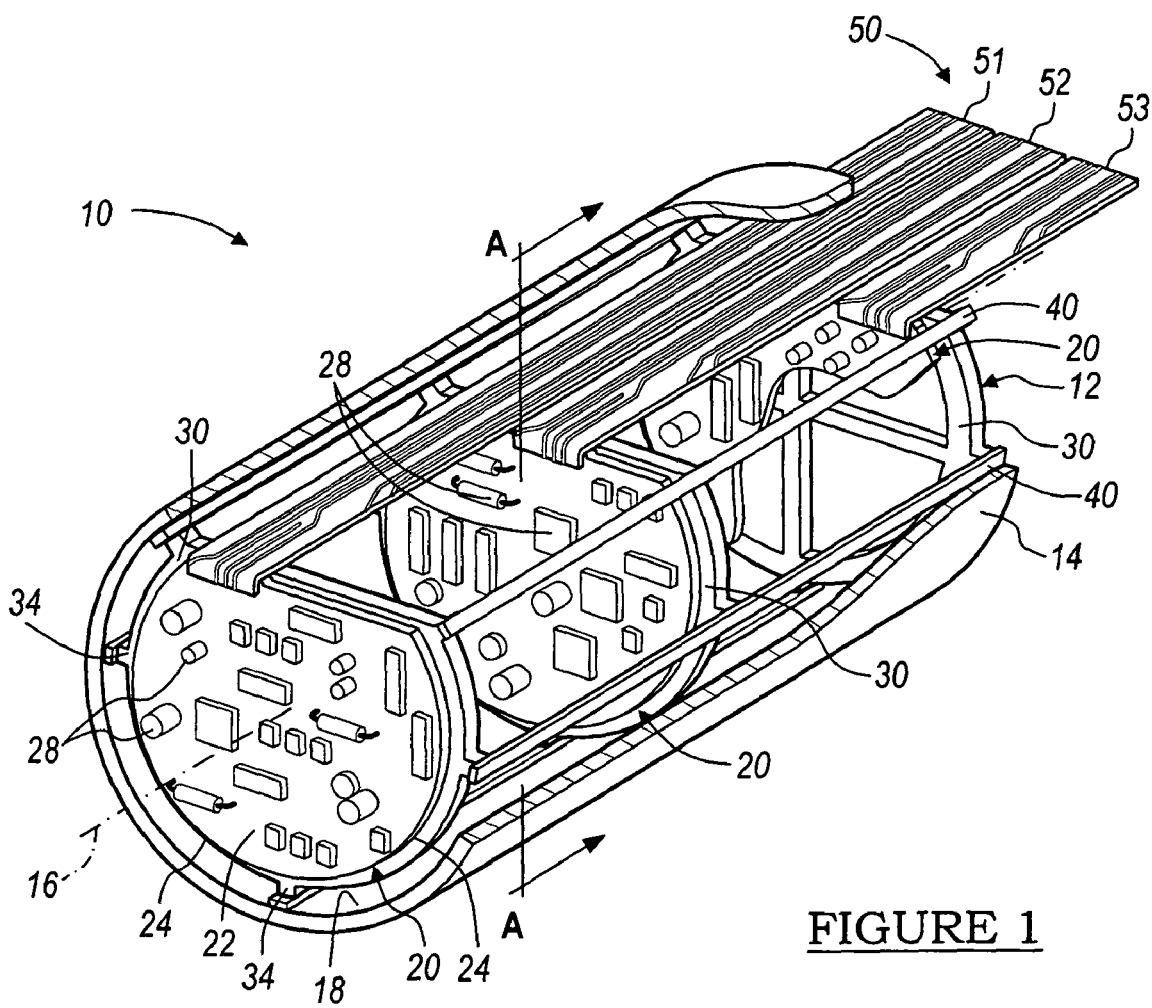
FIG. 1 is a perspective view of a package comprising a microelectronic assembly in accordance with a preferred embodiment of this invention.
Figure 3:
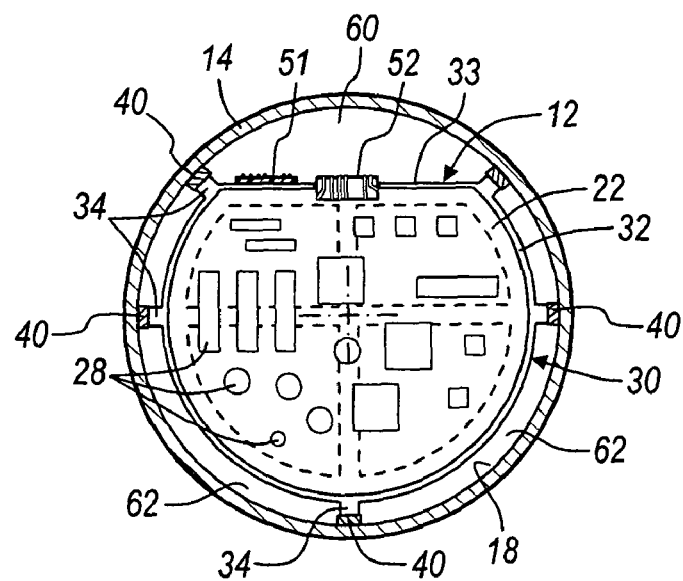
FIG. 3 is a cross sectional view of the package in FIG. 1 taken along line A—A in the direction of the arrows.
Figure 2:
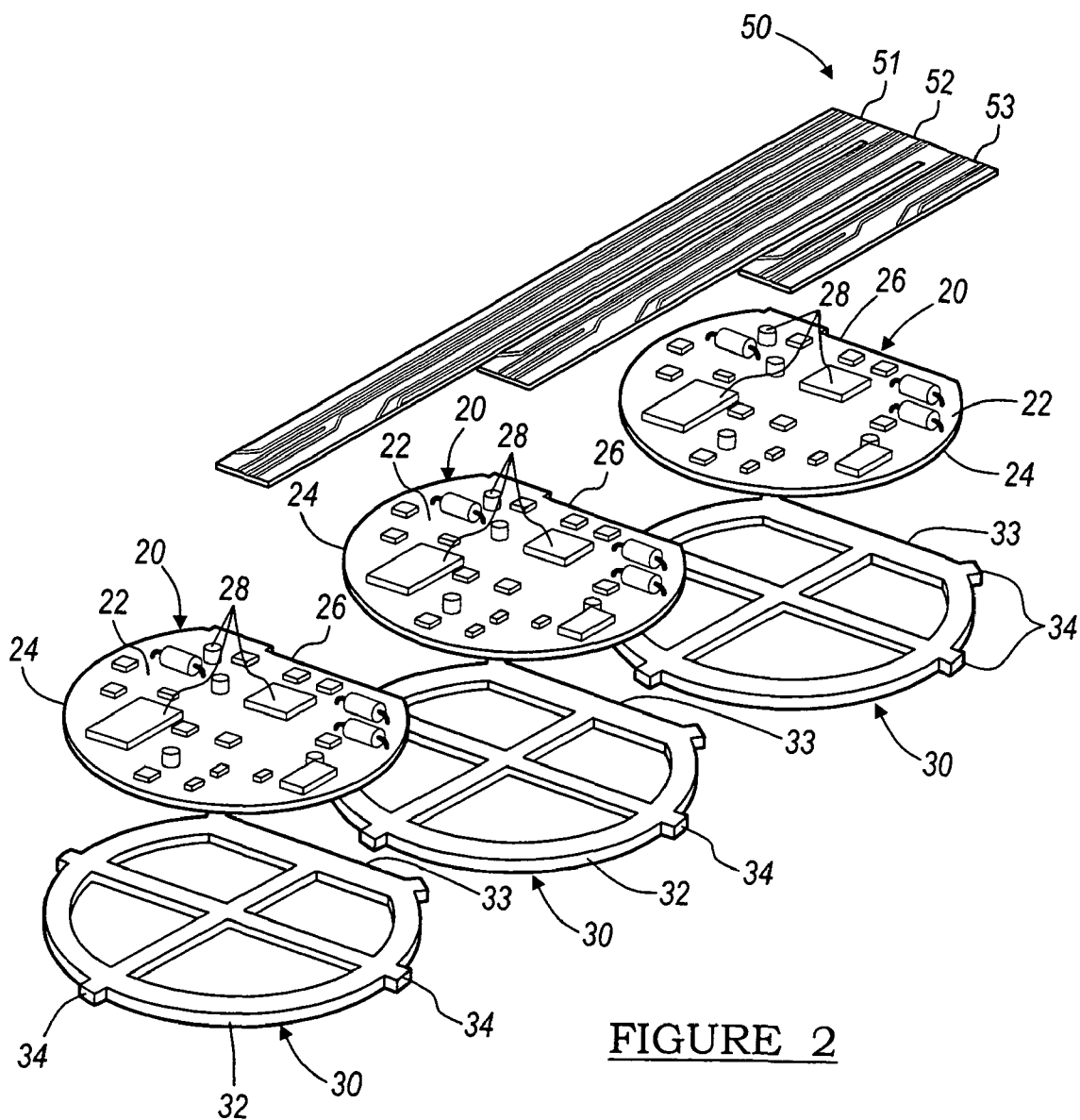
FIG. 2 showing elements of the microelectronic assembly in FIG. 1 in preparation for forming the assembly.

In accordance with the preferred embodiment of this invention, referring to FIGS. 1–3, a microelectronic package 10 comprises a microelectronic assembly 12 received in a tubular housing 14. Housing 14 is preferably formed of metal and is cylindrical about an axis 16, such that an inner wall 18 circumferentially surrounds assembly 12. By way of a preferred example, housing 14 may be a segment of a casing of a missile. While in FIG. 1, housing 14 is depicted as having a length similar to assembly 12, housing 14 may be axially extended to include space for containing additional components such as batteries, gyroscopic components, motors or radiance.

Assembly 12 comprises a plurality of microelectronic modules 20. While the figures depict an assembly that includes three modules 20, it will be understood that the assembly may suitably include two or more modules, depending upon the nature of the electronic operations to be carried out for the product. Each module 20 comprises a substrate 22 having a perimeter 24 that is generally circular and includes a chordal section 26. A plurality of electronic components 28 are mounted on substrates 22 and interconnected by circuit traces (not shown) that are carried on the substrate. Preferably, substrates 22 are formed of flexible dielectric membranes. Alternately, the assembly may suitably comprise substrates that are formed of rigid boards.

Modules 20 are mounted on supports 30. Supports 30 are preferably formed of metal to facilitate thermal dissipation of heat generated by the electronic components during use. Alternatively, the supports may suitably be formed of polymeric material or ceramic. Supports 30 are shaped generally similar to substrates 12 and include a edge 32 that is slightly outboard from substrate 22 to protect substrates 22 from contact during handling. Edge 32 includes a chordal section 33 adjacent chordal section 26 of the substrate. Supports 30 also include rib attachment tabs 34 that laterally protrude about edge 32. While in the Figures, the supports are depicted as having open regions, the supports may be a continuous plate without openings, or otherwise suitably sized and shaped to adequately support the modules.

Modules 20 and supports 30 are arranged in parallel spaced relationship perpendicular to axis 16 by ribs 40. Ribs 40 attach to tabs 34, with the tabs being inserted into slots in the ribs. Preferably, ribs 40 are formed of metal and enhance thermal dissipation from supports 30 to housing 14 during operation. When inserted into housing 14 to form package 10, ribs 40 contact inner wall 18 to securely position modules 20 and supports 30 with the housing and to space the modules and supports apart from inner wall 18. During operation, the spaces allow coolant gas to flow through housing 14 for purposes of thermal dissipation of heat generated by the electrical components.

Package 10 further comprises a flexible connection 50 that includes sections 51, 52 and 53. Sections 51, 52 and 53 have varying lengths and are attached to modules 20 adjacent chordal portions 26 and extend axially therefrom to provide for external connection electrical to the several modules 20.

One advantage of the preferred embodiment is that assembly 12 may be readily manufactured as a self-sustaining structure to facilitate installation in housing 14. Referring to FIG. 2, substrates 22, which are preferably formed of flexible polymeric membranes, are cut to the desired shape and individually processed to define circuit traces and populate the electronic components 28 to form the modules. Modules 20 are affixed to supports 30, either prior to or after attachment of the electronic components. Supports 30 are then positioned in a planar arrangement, as indicated in FIG. 2, and flexible circuit 50 is attached to each module 20 adjacent chordal section 26. It is an advantage of the preferred embodiment that all electrical connections to the several devices 20 are made conveniently while substrates 22 are in a co-planar arrangement and prior to positioning of the substrates in parallel arrangement, since the co-planar arrangement provides more convenient access to substrates 22 for purposes of making electrical connections. Following attachment of the flexible connection, supports 30 are then arranged in parallel, spaced relationship, and ribs 40 attach to tabs 34, to complete assembly 12. Assembly 12 is axially inserted into housing 14 to form package 10. It is pointed out that modules 20 are protected during handling and positioning of assembly 12 within housing 14 by edges 32 of supports 30 and ribs 40 that are disposed outboard from substrates 22.

During operation, heat generated by electrical components is dissipated by conduction through supports 30 and ribs 40 to housing 14. Also, heat is dissipated by connection via coolant gas flow axially through housing 14. Referring to FIG. 3, the ribs 40 position supports 30 to create a gap that substantially encircles modules 20. Also, because of the configuration of substrates 22 and supports 30 in the preferred embodiment, a relatively large gap 60 is formed adjacent chordal sections 26. Because of the gaps 62 about devices 20 apart from gap 60, coolant gas flows from space 60 through the space between adjacent devices 20. The increased circulation of coolant gas about devices 20 provides for enhanced thermal dissipation.

Therefore, this invention provides a compact, robust microelectronic assembly that includes multiple microelectronic modules that are mounted on planar supports and formed into a structure wherein the modules are in spaced, parallel arrangement. In this manner, the axial volume occupied by the modules in the housing may be reduced to increase the volume available for packaging additional components. The ribs join the microelectronic devices and supports into a self-sustaining structure to facilitate handling and installation into a tubular housing. During operation, the ribs and supports preferably conduct heat from the modules to the housing to maintain the electronic components at desired operating temperatures. Thermal dissipation is further enhanced by spacing between the supports and the housing that allows coolant gas flow about the modules.

While this invention has been described in terms of the particular embodiments thereof, it is not intended to be so limited, but rather only to the extent set forth in the claims that follow.

The invention claimed is:

1. An assembly having an axis and comprising:
   a housing having an inner wall and defining an axis,
   a first support perpendicular to the axis and having a first support perimeter,
   a first microelectronic module affixed to the first support,
   a second support perpendicular to the axis and having a second support perimeter;
   a second microelectronic module affixed to the second support; and
   a plurality of ribs, each rib being attached to the first support at the first support perimeter outboard the first microelectronic module and to the second support at the second support perimeter outboard the second microelectronic module and extending axially therebetween to maintain said first support and said second support in parallel, spaced relationship,
   the ribs engaging the inner wall of the housing and spacing the first and second microelectronic modules and the first and second supports apart from the inner wall when the microelectronic assembly is coaxially received in the housing.

2. The assembly of claim 1 further comprising a connector strip connected to the first microelectronic module and to the second microelectronic module and extending axially for connecting said first microelectronic module and said second microelectronic module to an external circuit.

3. The assembly of claim 1 wherein the first support perimeter and the second support perimeter are substantially coextensive.

4. The assembly of claim 1 wherein the first support perimeter comprises a first attachment tab projecting outwardly therefrom, and wherein the second support perimeter comprises a second attachment tab projecting outwardly therefrom, and wherein the assembly includes a rib of the plurality of ribs attached to the first attachment tab and the second attachment tab.

5. The assembly of claim 1 wherein the first microelectronic module comprises a flexible substrate and a plurality of electronic components attached to the flexible substrate.

6. The assembly of claim 5 wherein the second microelectronic module comprises a flexible substrate and a plurality of electronic components attached to the flexible substrate.

7. The assembly of claim 1 wherein the first microelectronic module is generally circular and includes a chordal edge, and wherein the assembly further comprises a connector strip connected to the first microelectronic module at said chordal edge.

8. The assembly of claim 1 wherein the spacing between the inner wall and the first and second microelectronic assemblies is adapted for cooling gas flow.

* * * * *